US009368161B2

(12) United States Patent
Tsao et al.

(10) Patent No.: US 9,368,161 B2
(45) Date of Patent: Jun. 14, 2016

(54) NONVOLATILE MEMORY CELL STRUCTURE WITH ASSISTANT GATE

(71) Applicant: eMemory Technology Inc., Hsin-Chu (TW)

(72) Inventors: Mu-Ying Tsao, Changhua County (TW); Wei-Ren Chen, Pingtung County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 14/675,758

(22) Filed: Apr. 1, 2015

(65) Prior Publication Data
US 2015/0287732 A1  Oct. 8, 2015

Related U.S. Application Data

(60) Provisional application No. 61/973,867, filed on Apr. 2, 2014.

(51) Int. Cl.
*H01L 29/76* (2006.01)
*H01L 29/94* (2006.01)
(Continued)

(52) U.S. Cl.
CPC .............. *G11C 5/06* (2013.01); *G11C 16/0408* (2013.01); *G11C 17/16* (2013.01); *G11C 17/18* (2013.01); *H01L 27/11206* (2013.01); *H01L 27/11529* (2013.01); *H01L 27/11573* (2013.01); *H01L 29/42368* (2013.01); *H01L 29/512* (2013.01); *H01L 29/7817* (2013.01); *H01L 29/7835* (2013.01); *H01L 23/5252* (2013.01); *H01L 29/93* (2013.01)

(58) Field of Classification Search
CPC . H01L 21/041; H01L 21/048; H01L 21/0257; H01L 21/043; H01L 21/242; H01L 21/762; H01L 21/8229; H01L 21/8238; H01L 27/0251; H01L 27/1104; H01L 27/3248; H01L 29/7816; H01L 29/66045; H01L 29/106; H01L 29/207
USPC ........... 257/380, 68, 296, 576, 607, 908, 914, 257/315, 316, 288, E21.008, E21.042, 257/E21.045, E21.051, E21.056, E21.061, 257/E21.126, E21.127, E21.395, E21.399, 257/E21.4, E21.412, E21.435, E21.632, 257/E21.645, E21.646, E21.654, E21.662, 257/E21.666, E21.68, E21.681, E21.682
See application file for complete search history.

(56) References Cited

U.S. PATENT DOCUMENTS 5,912,842 A * 6/1999 Chang ................. G11C 16/0416
                                                    365/185.11
5,966,329 A * 10/1999 Hsu ........................ G11C 16/10
                                                    365/185.18

(Continued)

*Primary Examiner* — David Nhu
(74) *Attorney, Agent, or Firm* — Winston Hsu; Scott Margo

(57) ABSTRACT

A nonvolatile memory (NVM) cell includes a semiconductor substrate having therein an N well and a P well; a first oxide define (OD) region and a second oxide define (OD) region disposed within the N well; a PMOS select transistor disposed on the first OD region; a PMOS floating gate transistor serially connected to the select transistor and being disposed on the on the first OD region, wherein the PMOS floating gate transistor comprises a floating gate overlying the first OD region; and an assistant gate protruding from one distal end of the floating gate to one edge of the second OD region such that the assistant gate is capacitively coupled to the second OD region and the N well. The select transistor, the floating gate transistor and the assistant gate disposed on the same N well.

12 Claims, 5 Drawing Sheets

(51) Int. Cl.
| | |
|---|---|
| *H01L 31/062* | (2012.01) |
| *H01L 31/113* | (2006.01) |
| *H01L 31/119* | (2006.01) |
| *G11C 5/06* | (2006.01) |
| *G11C 16/04* | (2006.01) |
| *G11C 17/16* | (2006.01) |
| *G11C 17/18* | (2006.01) |
| *H01L 27/112* | (2006.01) |
| *H01L 29/423* | (2006.01) |
| *H01L 29/78* | (2006.01) |
| *H01L 27/115* | (2006.01) |
| *H01L 29/51* | (2006.01) |
| *H01L 23/525* | (2006.01) |
| *H01L 29/93* | (2006.01) |

(56) References Cited

U.S. PATENT DOCUMENTS

| | | | | |
|---|---|---|---|---|
| 6,914,825 | B2 * | 7/2005 | Hsu | H01L 27/11558 257/E21.694 |
| 8,344,443 | B2 * | 1/2013 | Chen | G11C 16/10 257/318 |
| 9,041,089 | B2 * | 5/2015 | Chen | H01L 27/11524 257/315 |
| 2015/0091073 | A1 * | 4/2015 | Li | H01L 29/7881 257/316 |

* cited by examiner

| | $V_{SL}$ | $V_{BL}$ | $V_{NW}$ | $V_{WL}$ | $V_{EL}$ | $V_{PW}$ | Mode |
|---|---|---|---|---|---|---|---|
| PGM | $V_{PP}$ | 0V | $V_{PP}$ | $V_{DD}$ | $V_{DD}$ | 0V | CHEI |
| ERS | 0V | 0V | 0V | 0V | $V_{EE}$ | 0V | FN |
| READ | $V_{DD}$ | 0V | $V_{DD}$ | 0V | 0V | 0V | |

NONVOLATILE MEMORY CELL STRUCTURE WITH ASSISTANT GATE

CROSS REFERENCE TO RELATED APPLICATIONS

This application claims priority from U.S. provisional application No. 61/973,867 filed Apr. 2, 2014, which is incorporated herein by reference in its entirety.

BACKGROUND OF THE INVENTION

1. Field of the Invention

The present invention relates generally to the filed of non-volatile memory (NVM) devices. More particularly, the present invention relates to a single-poly NVM cell structure with an assistant gate (AG).

2. Description of the Prior Art

Non-volatile memory devices, such as EEPROM and flash memory, are widely used in electronic devices to store data that can be electrically erased and reprogrammed and that must be saved when power is removed. Generally, NVM devices may be divided into multi-time programmable (MTP) memory and one-time programmable (OTP) memory. MTP memory is multi-readable and multi-writable. For example, EEPROM and flash memory are designedly equipped with some corresponding electric circuits to support different operations such as programming, erasing and reading. OTP functions perfectly with electric circuits with mere programming and reading functions. Electric circuits for erasing operation are not required in OTP.

Single-poly NVM designs have been proposed which reduce the additional processing cost. A single-poly NVM forms the charge-storage floating gate with a single layer of polysilicon. Because the single-poly NVM is compatible with regular CMOS process, it is applied in the field of embedded memory, embedded nonvolatile memory in the mixed-mode circuits and micro-controllers (such as System on Chip, SOC), for example.

It is known that programming of memory cell can be accomplished by hot electron injection techniques (also known as channel hot electron or CHE programming). Leakage current during programming and verification operations is exacerbated as the core device length is reduced. Moreover, as flash memory devices are scaled down and the channel length of the memory cells is reduced, program disturbs of adjacent devices also increase. Program disturb may occur in adjacent memory cells that share the same wordline as the memory cell being programmed. Further, as dimensions and tunneling oxide of the memory cell unit continue to shrink, the data retention loss or charge leakage from the floating gate looms as an increasingly serious problem. Therefore, there is a strong need in this industry to improve the data retention or endurance characteristics of the NVM cell structure.

SUMMARY OF THE INVENTION

It is one objective of the invention to provide an improved single-poly NVM cell structure with an assistant gate, which is capable of achieving higher endurance, larger ON/OFF window, reducing program current (by about 20%) and/or program voltage, and alleviating program disturbs.

According to one embodiment of the invention, a nonvolatile memory (NVM) cell includes a semiconductor substrate having therein an N well and a P well; a first OD region and a second OD region disposed within the N well; a PMOS select transistor disposed on the first OD region; a PMOS floating gate transistor serially connected to the select transistor and being disposed on the on the first OD region, wherein the PMOS floating gate transistor comprises a floating gate overlying the first OD region; and an assistant gate protruding from one distal end of the floating gate to one edge of the second OD region such that the assistant gate is capacitively coupled to the second OD region and the N well. The select transistor, the floating gate transistor and the assistant gate are disposed on the same N well.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIGS. 5 and 6 illustrate the equivalent circuit and exemplary operation conditions for programming (PGM), reading (READ) or erasing (ERS) operations of the memory cell unit as set forth in FIG. 1;

Figure 1:
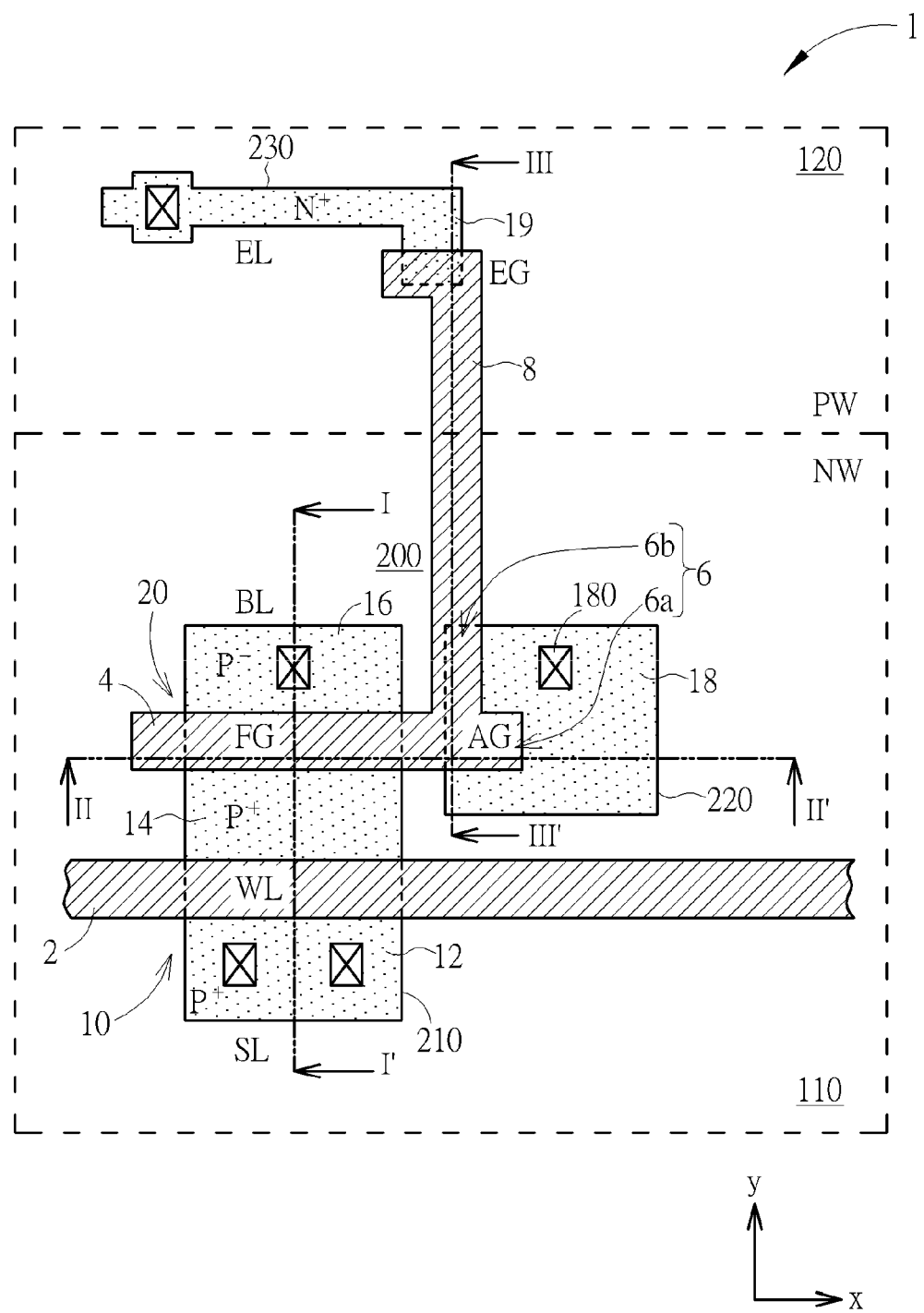
FIG. 1 is a schematic plan view of a layout of a single-poly, nonvolatile memory cell unit in accordance with one embodiment of this invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some system configurations and process steps are not disclosed in detail, as these should be well-known to those skilled in the art. Other embodiments may be utilized and structural, logical, and electrical changes may be made without departing from the scope of the present invention.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

The term "oxide define (OD) region" ("OD" region is sometimes referred to as "oxide defined" region or "oxide definition" region) is commonly known in this technical field to be defined as a region on a silicon main surface of a substrate other than a local oxidation of silicon (LOCOS) or a shallow trench isolation (STI) region. The term "oxide define (OD) region" is also commonly referred to as an "active area" where the active circuit elements such as transistors are formed and operated.

Figure 2:
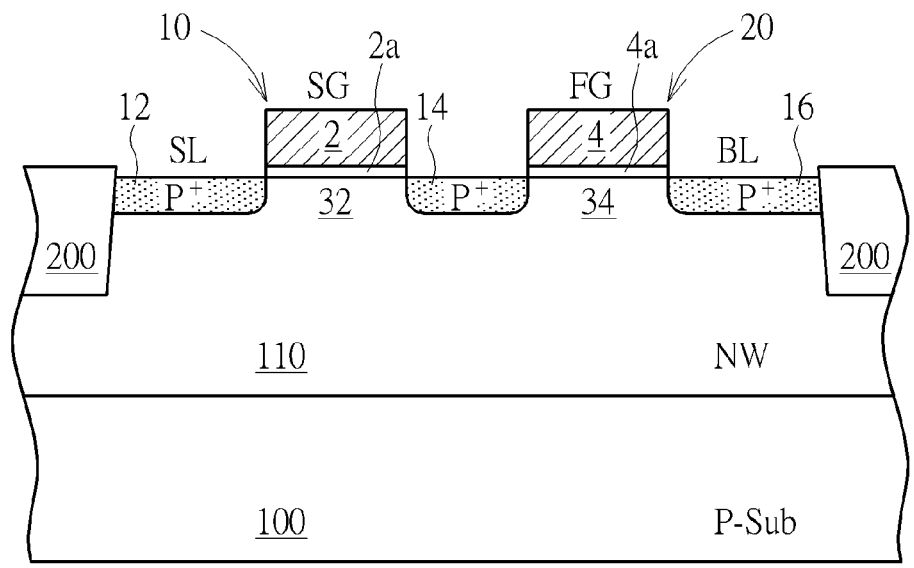
FIG. 2 is a schematic, cross-sectional diagram taken along line I-I' of FIG. 1.
Figure 3:
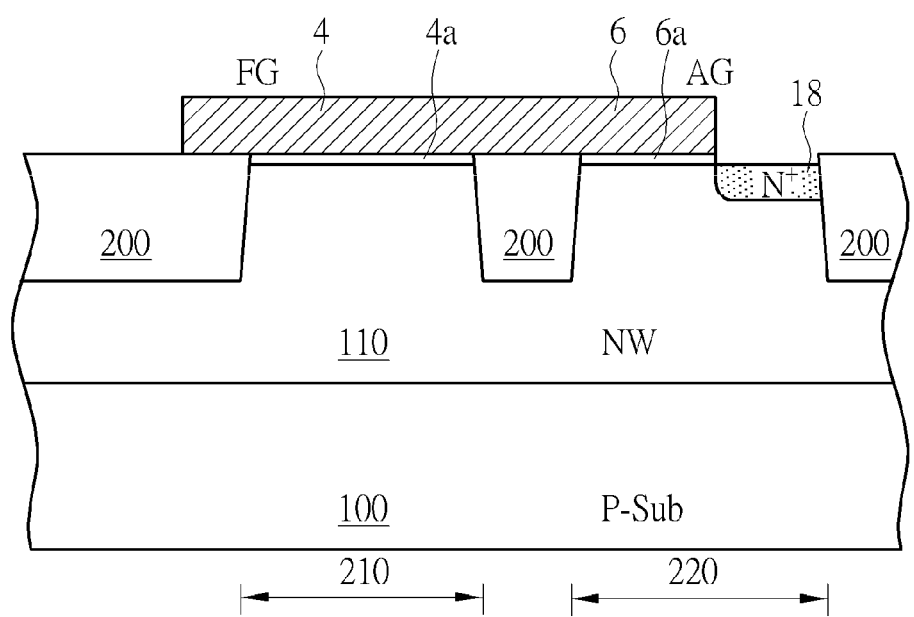
FIG. 3 is a schematic, cross-sectional diagram taken along line II-II' of FIG. 1.
Figure 4:
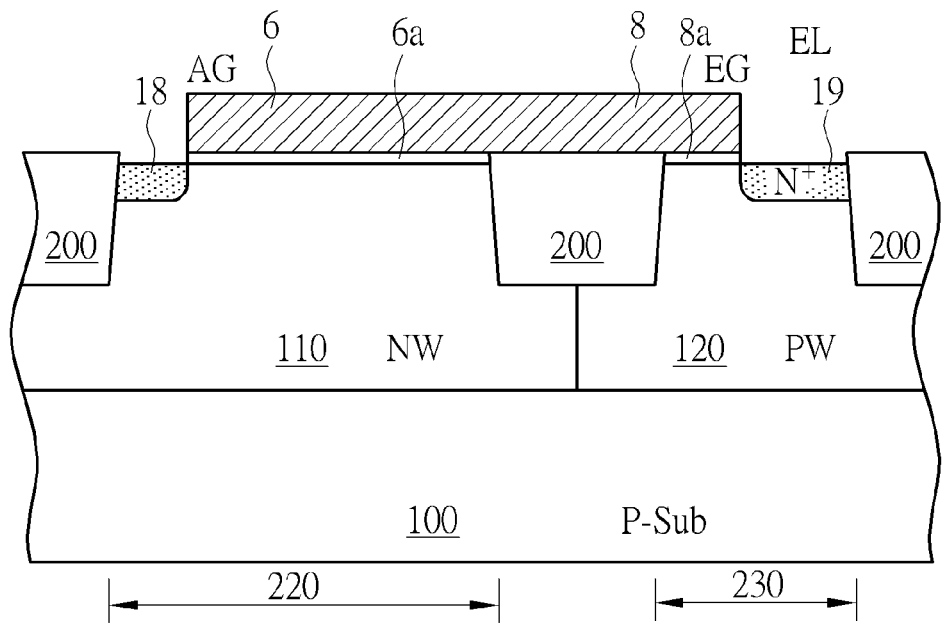
FIG. 4 is a schematic, cross-sectional diagram taken along line III-III' of FIG. 1.

FIGS. 1-4 are schematic diagrams demonstrating a single-poly NVM cell structure in accordance with one embodiment of this invention. FIG. 1 is a schematic plan view of a layout of a single-poly, nonvolatile memory cell unit in accordance with one embodiment of this invention. FIG. 2 is a schematic, cross-sectional diagram taken along line I-I' of FIG. 1. FIG. 3 is a schematic, cross-sectional diagram taken along line II-II' of FIG. 1. FIG. 4 is a schematic, cross-sectional diagram taken along line III-III' of FIG. 1. The demonstrated NVM cell structure may function as a multi-time programmable (MTP) memory unit. It is to be understood that the present invention may be applicable to other memory devices.

As shown in FIG. 1, the NVM cell 1 comprises three spaced-apart oxide define (OD) regions arranged in close proximity to one another. The three spaced-apart OD regions includes a first OD region 210, a second OD region 220, and a third OD region 230, which are isolated from one another by an isolation region 200 that is embedded in a main surface of a semiconductor substrate 100 such as a P type doped silicon substrate (P-Sub). According to the illustrative embodiment, the isolation region 200 may be a shallow trench isolation (STI) region, but should not be limited thereto. It is to be understood that the layout in FIG. 1 is for illustrative purposes only.

According to the illustrative embodiment, the first OD region 210 and the second OD region 220 are formed within an N well (NW) 110, while the third OD region 230 is formed within a P well (PW) 120.

As can be seen in FIG. 1 and FIG. 2, the NVM cell 1 comprises a select transistor 10 and a floating gate transistor 20 serially connected to the select transistor 10. The serially connected select transistor 10 and the floating gate transistor 20 may be formed directly on the first OD region 210. According to the illustrative embodiment, the select transistor 10 may be a PMOS transistor and comprises a $P^+$ source doping region 12 (coupled to a source line SL) in the N well 110, a common $P^+$ doping region 14 spaced apart from the $P^+$ source doping region 12, a select gate channel region 32 near the main surface of the semiconductor substrate 100 between the $P^+$ source doping region 12 and the common $P^+$ doping region 14, a select gate (SG) 2 coupled to a wordline (WL) overlying the select gate channel region 32, and a gate dielectric layer $2a$ between the select gate 2 and the select gate channel region 32. Sidewall spacers (not shown) may be formed on opposite sidewalls of the select gate 2.

The floating gate transistor 20 is formed directly on the first OD region 210. The floating gate transistor 20 is coupled to the select transistor 10 through the common $P^+$ doping region 14. The common $P^+$ doping region 14 is shared by the floating gate transistor 20 and the select transistor 10, thereby forming two serially connected transistors, and in this case, two serially connected PMOS transistors.

The floating gate transistor 20 comprises a floating gate (FG) 4 overlying the first OD region 210. According to the illustrative embodiment, the floating gate 4 consists of a single layer of polysilicon, for example, $N^+$ doped polysilicon or $P^+$ doped polysilicon. According to the illustrative embodiment, the floating gate transistor 20 serves as the charge storage element of the NVM cell 1. According to the illustrative embodiment, both of the select gate 2 and the floating gate 4 are straight line-shaped and extend along a first direction (reference x-axis).

The floating gate transistor 20 further comprises the common $P^+$ doping region 14 on one side of the floating gate (FG) 4, a $P^+$ drain doping region 16 on the other side of the floating gate 4, a floating gate channel region 34 between the common $P^+$ doping region 14 and the $P^+$ drain doping region 16 (coupled to a bit line BL), and a gate dielectric layer $4a$ between the floating gate 4 and the floating gate channel region 34. According to the illustrative embodiment, the gate dielectric layer $4a$ has a thickness that is substantially equal to that of the gate dielectric layer $2a$. According to the illustrative embodiment, the select transistor 10 and the floating gate transistor 20 share the same N well 110.

As can be seen in FIGS. 1 and FIG. 3, according to the illustrative embodiment, the NVM cell 1 further comprises an assistant gate (AG) 6 that protrudes from one distal end of the floating gate 4 to one edge of the second OD region 220 such that the assistant gate (AG) 6 is capacitively coupled to the second OD region 220 and the N well 110. When viewed from above, the assistant gate (AG) 6 partially overlaps with the second OD region 220 and partially overlaps with the edge that directly faces the first OD region 210.

A $N^+$ doping region 18 may be formed within an area of the second OD region 220 not covered by the assistant gate (AG) 6. The $N^+$ doping region 18 functions as N well pick-up contact may be provided on the second OD region 220 to provide the N well 110 with an N well voltage ($V_{NW}$). According to the illustrative embodiment, no additional doping region or ion well is required between the assistant gate 6 and the N well 110. According to the illustrative embodiment, an induced voltage coupled from the assistant gate (AG) 6 is controlled by the N well voltage ($V_{NW}$). The induced voltage generated because of the coupling effect between the assistant gate (AG) 6 and the biased N well will increase more carriers tunneling to the floating gate during the program operation so that the program efficiency of the memory cell is improved. According to the illustrative embodiment, the assistant gate (AG) 6 may be composed of $N^+$ doped polysilicon or $P^+$ doped polysilicon.

According to the illustrative embodiment, the assistant gate (AG) 6 may comprise a horizontal segment $6a$ that extends continuously from the floating gate (FG) 4 along the first direction (reference x-axis) and is directly connected to the floating gate (FG) 4. According to the illustrative embodiment, the assistant gate (AG) 6 may further comprise a vertical segment $6b$ that extends along a second direction (reference y-axis) and is directly connected to the horizontal segment $6a$.

According to the illustrative embodiment, the assistant gate (AG) 6 is formed integrally with the floating gate 4 using the same fabrication processes. According to the illustrative embodiment, the assistant gate (AG) 6 can be self-biasing from the N well voltage ($V_{NW}$). Moreover, it is able to increase coupling ratio and program efficiency. Furthermore, the assistant gate (AG) 6 is able to reduce program disturbs and program current/voltage. Furthermore, the NVM cell 1 is able to suppress off-state current as well as $I_{OFF}$ rising issue, so as to achieve higher endurance and larger ON/OFF window. The assistant gate (AG) 6 offers the floating gate transistor 20 extra capability to compensate coupling ratio and hence controls the channel better.

As can be seen in FIGS. 1 and FIG. 4, according to the illustrative embodiment, the NVM cell 1 may further comprise an erase gate (EG) 8 that extends continuously from the vertical segment $6b$ along the second direction (reference y-axis) and traverses the junction between the N well 110 and the P well 120. According to the illustrative embodiment, one distal end of the erase gate (EG) 8 overlaps with the third OD region 230 that is formed within the P well 120. By providing such configuration, the erase gate (EG) 8 is capacitively coupled to the third OD region 230 and the P well 120. An N+ doping region 19 may be formed within an area of the third OD region 230 not covered by the erase gate (EG) 8.

Figure 5:
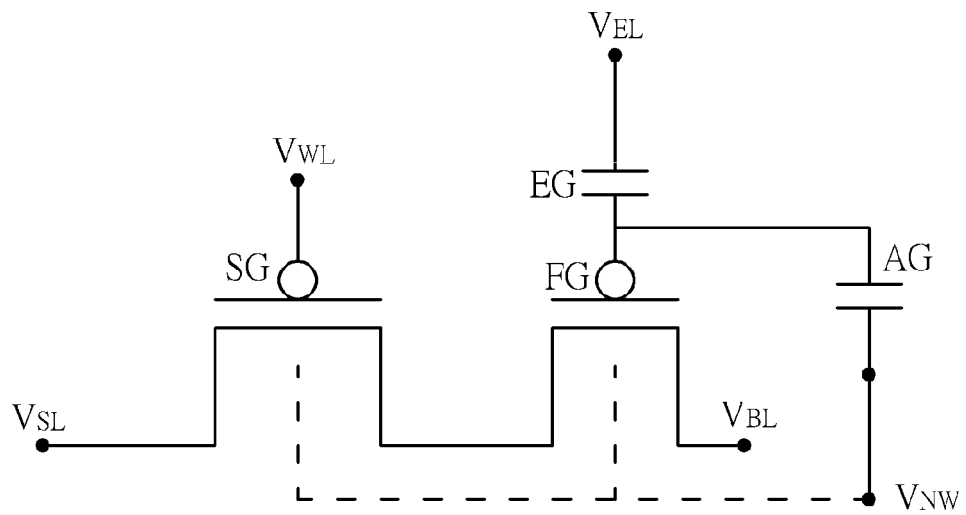

FIGS. 5 and 6 illustrate the equivalent circuit and exemplary operation conditions for programming (PGM), reading (READ) or erasing (ERS) operations of the memory cell unit as set forth in FIG. 1. As shown in FIGS. 5 and 6, during PGM operation, the select gate (SG) is coupled to a wordline voltage $V_{WL}=V_{DD}$. The erase line (EL) is coupled to an erase line voltage $V_{EL}=V_{DD}$. The source line (SL) is coupled to a source line voltage $V_{SL}=V_{PP}$. The bit line (BL) is grounded ($V_{BL}=0V$). The N well (NW) 110 is coupled to an N well voltage $V_{NW}=V_{PP}$. The P well (PW) 120 is coupled to a P well voltage $V_{PW}=0V$. According to the illustrative embodiment, $V_{PP}$ and $V_{EE}$ may range between 2V and 15V. According to the illustrative embodiment, $V_{DD}$ may range between 2V and 10V. Under the aforesaid conditions, the NVM cell 1 may be programmed by channel hot electron injection (CHEI) mechanism.

During erasing (ERS) operation, the select gate (SG) is coupled to a wordline voltage $V_{WL}=0V$. The erase line (EL) is coupled to an erase line voltage $V_{EL}=V_{EE}$. The source line (SL) is coupled to a source line voltage $V_{SL}=0V$. The bit line (BL) is grounded ($V_{BL}=0V$). The N well (NW) 110 is coupled to an N well voltage $V_{NW}=0V$. The P well (PW) 120 is coupled to a P well voltage $V_{PW}=0V$. According to the illustrative embodiment, $V_{PP}$ and $V_{EE}$ may range between 2V and 15V. According to the illustrative embodiment, $V_{DD}$ may range between 2V and 10V. Under the aforesaid conditions, the NVM cell 1 may be erased by Fowler Nordheim (FN) mechanism.

During READ operation, the select gate (SG) is coupled to a select gate voltage $V_{WL}=0V$. The erase line (EL) is coupled to an erase line voltage $V_{EL}=0V$. The source line (SL) is coupled to a source line voltage $V_{SL}=V_{DD}$. The bit line (BL) is grounded ($V_{BL}=0V$). The N well (NW) 110 is coupled to an N well voltage $V_{NW}=V_{DD}$. The P well (PW) 120 is coupled to a P well voltage $V_{PW}=0V$. According to the illustrative embodiment, $V_{PP}$ and $V_{EE}$ may range between 2V and 15V. According to the illustrative embodiment, $V_{DD}$ may range between 2V and 10V.

Figure 7:
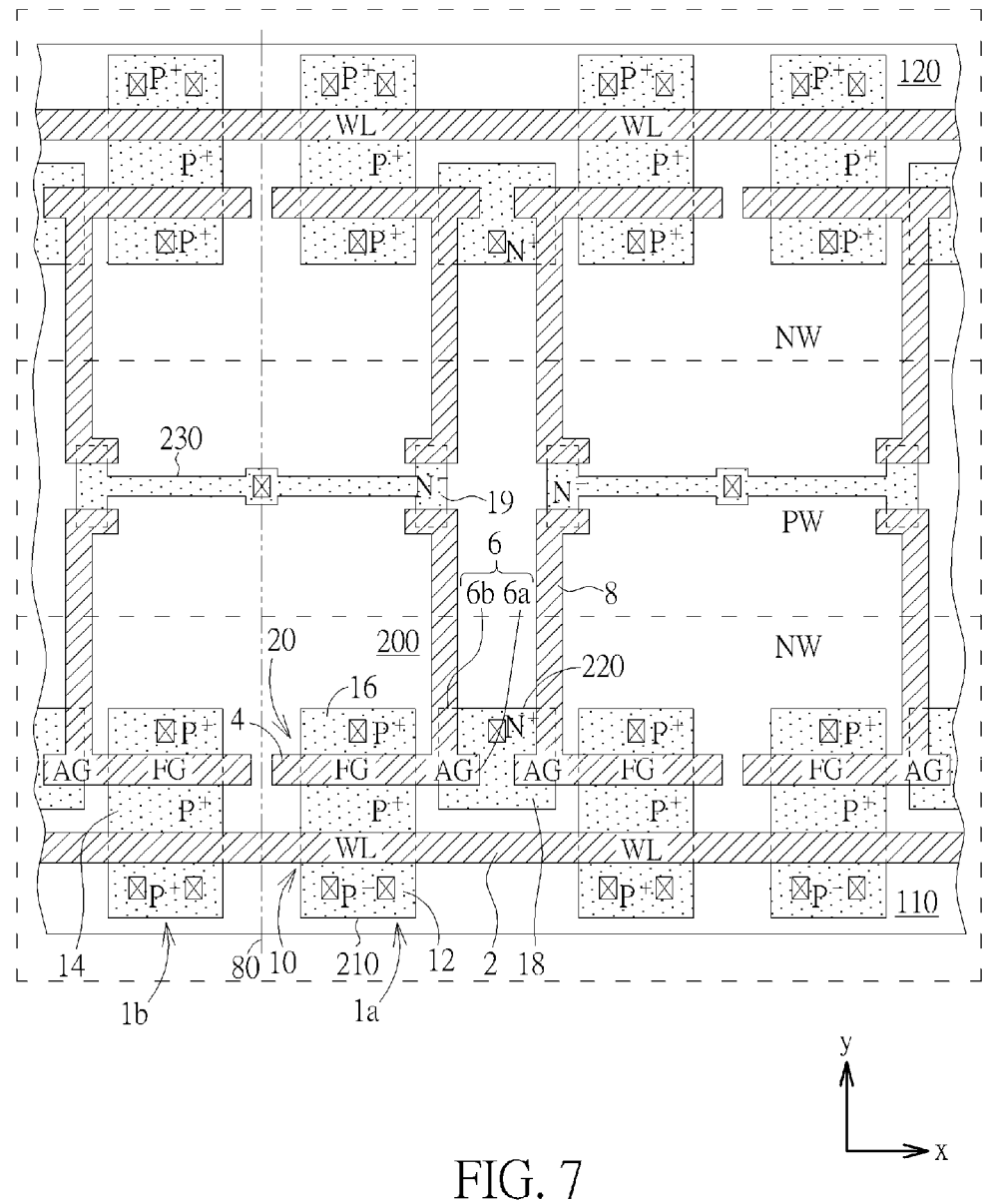
FIG. 7 illustrates a partial layout diagram of a memory array comprising the NVM cell as set forth in FIG. 1.

FIG. 7 illustrates a partial layout diagram of a memory array comprising the NVM cell 1 as set forth in FIG. 1. As shown in FIG. 7, the memory array comprises at least an NVM cell 1a and an NVM cell 1b. The NVM cell 1a has substantially the same structure as that set forth in FIG. 1. The NVM cell 1b has a structure that is mirror symmetric to the NVM cell 1a with respect to the central line 80.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A nonvolatile memory (NVM) cell, comprising:
a semiconductor substrate having therein an N well;
a first oxide define (OD) region and a second oxide define (OD) region disposed within the N well;
a PMOS select transistor disposed on the first OD region;
a PMOS floating gate transistor serially connected to the PMOS select transistor and being disposed over the first OD region, wherein the PMOS floating gate transistor comprises a floating gate overlying the first OD region; and
an assistant gate protruding from one distal end of the floating gate to one edge of the second OD region such that the assistant gate is capacitively coupled to the N well, wherein an induced voltage coupled from the assistant gate is controlled by a bias of the N Well, wherein the PMOS floating gate transistor serves as a charge storage element of the NVM cell.

2. A nonvolatile memory (NVM) cell, comprising:
a semiconductor substrate having therein an N well;
a first oxide define (OD) region and a second oxide define (OD) region disposed within the N well;
a PMOS select transistor disposed on the first OD region;
a PMOS floating gate transistor serially connected to the PMOS select transistor and being disposed over the first OD region, wherein the PMOS floating gate transistor comprises a floating gate overlying the first OD region; and
an assistant gate protruding from one distal end of the floating gate to one edge of the second OD region such that the assistant gate is capacitively coupled to the N well, wherein an induced voltage coupled from the assistant gate is controlled by a bias of the N Well, wherein the assistant gate is formed integrally with the floating gate using a single layer of polysilicon.

3. A nonvolatile memory (NVM) cell, comprising:
a semiconductor substrate having therein an N well;
a first oxide define (OD) region and a second oxide define (OD) region disposed within the N well;
a PMOS select transistor disposed on the first OD region;
a PMOS floating gate transistor serially connected to the PMOS select transistor and being disposed over the first OD region, wherein the PMOS floating gate transistor comprises a floating gate overlying the first OD region; and
an assistant gate protruding from one distal end of the floating gate to one edge of the second OD region such that the assistant gate is capacitively coupled to the N well, wherein an induced voltage coupled from the assistant gate is controlled by a bias of the N Well, wherein the assistant gate comprises N+ doped polysilicon or P+ doped polysilicon.

4. A nonvolatile memory (NVM) cell, comprising:
a semiconductor substrate having therein an N well;
a first oxide define (OD) region and a second oxide define (OD) region disposed within the N well;
a PMOS select transistor disposed on the first OD region;
a PMOS floating gate transistor serially connected to the PMOS select transistor and being disposed over the first OD region, wherein the PMOS floating gate transistor comprises a floating gate overlying the first OD region; and
an assistant gate protruding from one distal end of the floating gate to one edge of the second OD region such that the assistant gate is capacitively coupled to the N well, wherein an induced voltage coupled from the assistant gate is controlled by a bias of the N Well, wherein the assistant gate comprises a horizontal segment that extends continuously from the floating gate along a first direction and is directly connected to the floating gate, wherein the assistant gate further comprises a vertical segment that extends along a second direction and is directly connected to the horizontal segment.

5. The NVM cell according to claim 1 further comprising a P well disposed within the semiconductor substrate and a third oxide define (OD) region disposed within the P well.

6. The NVM cell according to claim 5 further comprising an erase gate extending continuously from the floating gate and traversing a junction between the N well and the P well.

7. The NVM cell according to claim 6, wherein one distal end of the erase gate overlaps with the third OD region such that the erase gate is capacitively coupled to the third OD region and the P well.

8. The NVM cell according to claim 1, wherein the select transistor and the floating gate transistor share the N well.

9. The NVM cell according to claim 1, wherein the select transistor comprises a P+ source doping region in the N well, a common P+ doping region spaced apart from the P+ source doping region, a select gate channel region near a main surface of the semiconductor substrate between the P+ source doping region and the common P+ doping region, a select gate overlying the select gate channel region, and a gate dielectric layer between the select gate and the select gate channel region.

10. The NVM cell according to claim 9, wherein the P+ source doping region is coupled to a source line SL.

11. The NVM cell according to claim 9, wherein the floating gate transistor further comprises the common P+ doping region on one side of the floating gate, a P+ drain doping region on the other side of the floating gate, a floating gate channel region between the common P+ doping region and the P+ drain doping region, and a gate dielectric layer between the floating gate and the floating gate channel region.

12. The NVM cell according to claim 11, wherein the P+ drain doping region is coupled to a bit line BL.

* * * * *